US007816862B2

(12) United States Patent
Noguchi et al.

(10) Patent No.: US 7,816,862 B2
(45) Date of Patent: Oct. 19, 2010

(54) ELECTROLUMINESCENT DEVICE WITH ENHANCED COLOR RENDITION

(75) Inventors: Takafumi Noguchi, Kanagawa (JP); Kazuhiro Hasegawa, Kanagawa (JP); Tadanobu Sato, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 724 days.

(21) Appl. No.: 11/081,588

(22) Filed: Mar. 17, 2005

(65) Prior Publication Data

US 2005/0206302 A1 Sep. 22, 2005

(30) Foreign Application Priority Data

Mar. 19, 2004 (JP) .......................... P. 2004-079640
Dec. 8, 2004 (JP) .......................... P. 2004-354950

(51) Int. Cl.
*H01J 1/62* (2006.01)
(52) U.S. Cl. .................. 313/506; 313/503; 313/504; 313/486; 313/501; 428/690; 252/301.6 S
(58) Field of Classification Search ................ None
See application file for complete search history.

(56) References Cited

U.S. PATENT DOCUMENTS

| 3,052,810 | A | * | 9/1962 | Mash ...................... 313/506 |
| 4,035,686 | A | * | 7/1977 | Fleming ................... 313/503 |
| 4,945,009 | A | | 7/1990 | Taguchi et al. |
| 4,983,469 | A | | 1/1991 | Huzino et al. |
| 5,289,171 | A | | 2/1994 | Nire et al. |
| 6,806,642 | B2 | * | 10/2004 | Pires et al. ................ 313/506 |
| 6,817,735 | B2 | * | 11/2004 | Shimizu et al. ............ 362/231 |
| 2003/0017361 | A1 | * | 1/2003 | Thompson et al. .......... 428/690 |
| 2003/0111955 | A1 | * | 6/2003 | McNulty et al. ............ 313/504 |
| 2003/0218420 | A1 | * | 11/2003 | Zovko ....................... 313/506 |
| 2005/0073245 | A1 | * | 4/2005 | Gong et al. ................ 313/502 |
| 2005/0104509 | A1 | * | 5/2005 | Yamashita ................. 313/503 |

FOREIGN PATENT DOCUMENTS

| JP | 56-050084 A | 5/1981 |
| JP | 58-35587 A | 3/1983 |
| JP | 63-88790 A | 4/1988 |
| JP | 63-121296 A | 5/1988 |
| JP | 63-152897 A | 6/1988 |

(Continued)

OTHER PUBLICATIONS

Machine English translation of JP 2004099464 to Shirota et al.*

(Continued)

*Primary Examiner*—Sikha Roy
(74) *Attorney, Agent, or Firm*—Sughrue Mion, PLLC

(57) ABSTRACT

To provide an electroluminescent device excellent in color rendition, the electroluminescent device has at least two luminescent local maxima in a visible range, the at least two luminescent local maxima including a first luminescent local maximum and a second luminescent local maximum, the first and second luminescent local maxima have the two largest values of the at least two luminescent local maxima, wherein the electroluminescent device has the first luminescent local maximum in a range of from 450 to 530 nm, and the electroluminescent device has the second local luminescent local maximum in a range of 605 nm or more.

16 Claims, 1 Drawing Sheet

FOREIGN PATENT DOCUMENTS

| | | |
|---|---|---|
| JP | 63-218194 A | 9/1988 |
| JP | 63-224190 A | 9/1988 |
| JP | 03-207786 A | 9/1991 |
| JP | 04-071192 A | 3/1992 |
| JP | 07-282978 A | 10/1995 |
| JP | 08-245956 A | 9/1996 |
| JP | 2004099464 A * | 4/2004 |

OTHER PUBLICATIONS

'White-light-emitting organic electroluminescent devices based on interlayer sequential energy transfer' Deshpande, R. S. et al., Applied Physics Letters vol. 75 No. 7 pp. 888-890, 1999.*

Japanese Office Action dated Jan. 6, 2010, in Application No. 2004-354950.

* cited by examiner

ELECTROLUMINESCENT DEVICE WITH ENHANCED COLOR RENDITION

FIELD OF THE INVENTION

The present invention relates to an electroluminescent device, and more particularly, relates to such an electroluminescent device that is excellent in color rendition.

BACKGROUND OF THE INVENTION

An electroluminescence (hereinafter, sometimes simply referred to as EL) element is a planar light source, and there has been known a dispersion EL element containing fluorescent powder held between electrodes. The dispersion EL device generally has such a structure that fluorescent powder dispersed in a binder having a high dielectric constant is held between two electrodes, at least one of which is transparent, and the element emits light upon applying an alternating electric field to the electrodes.

The dispersion EL device formed by using fluorescent powder has many advantages, such as a thinner shape of several millimeters or less, a planar light source, and a less amount of heat generated, and owing to the advantages, the dispersion EL device is used in various applications, such as road signs, interior and exterior illuminations, light sources for flat panel displays, such as liquid crystal displays, and illuminating light sources for large area advertising boards.

The dispersion EL element can be formed into a flexible element using a plastic substrate since no high temperature process is used. The dispersion EL element can be produced at low cost through a relatively simple process without a vacuum equipment used, and the luminescent color thereof can be easily control led by mixing plural kinds of fluorescent powder having different luminescent colors. Owing to these advantages, the dispersion EL element is applied to various display elements, such as a backlight of a liquid crystal display (LCD) device.

FIG. 2 is a graph showing luminescent waveforms of commercially available dispersion EL elements emitting white light. As shown in FIG. 2, the white dispersion EL device currently available has such a luminescent waveform that the luminescent intensity thereof is concentrated mainly to two wavelength regions.

The white dispersion EL element has various advantages as a flexible planar light source as having been described, but involves a problem where the color rendition thereof is inferior to the other white light sources, such as a fluorescent lamp. For example, in the case where a transparent medium, such as a transparent positive image, is observed on the dispersion EL element, the color reproducibility is inferior to the case where it is observed under the conventional planar light source, such as a fluorescent lamp.

SUMMARY OF THE INVENTION

An object of the invention is to provide an electroluminescent device excellent in color rendition. In particular, the invention is to provide an electroluminescent device emitting white light with such a luminescent intensity distribution (i.e., luminescent waveform) that exhibits excellent color rendition.

The aforementioned and other objects of the invention can be accomplished by the following embodiments.

1. An electroluminescent device having at least two luminescent local maximum in a visible range, the at least two luminescent local maxima including a first luminescent local maximum and a second luminescent local maximum, the first and second luminescent local maxima having the two largest values of the at least two luminescent local maxima, wherein the electroluminescent device has the first luminescent local maximum in a range of from 450 to 530 nm, and the electroluminescent device has the second local luminescent local maximum in a range of 605 nm or more.

2. The electroluminescent device as described in item 1, which has the second luminescent local maximum in a range of from 605 to 615 nm.

3. The electroluminescent device as described in item 1 or 2, which has the first luminescent local maximum in a range of from 477 to 498 nm.

4. The electroluminescent device as described in item 1 or 2, which has the first luminescent local maximum in a range of from 483 to 493 nm.

5. The electroluminescent device as described in any one of items 1 to 4, which has a luminescent local minimum in a range of from 565 to 583 nm.

6. The electroluminescent device as described in any one of items 1 to 5, which device has a luminescent local minimum in a range of from 571 to 583 nm.

7. The electroluminescent device as described in any one of items 1 to 6, which has a ratio of a value of the first luminescent local maximum to a value of the second luminescent local maximum of from 2/8 to 8/2.

8. The electroluminescent device as described in any one of items 1 to 7, which comprises:
a pair of electrodes, at least one of the pair of the electrodes being a transparent electrode; and
a light emitting layer between the pair of the electrodes, wherein the light emitting layer comprises a luminescent layer; a light scattering layer; and a pigment layer in this order.

9. The electroluminescent device as described in item 8, where in the light emitting layer includes a dielectric layer.

10. The electroluminescent device as described in item 8 or 9, wherein the light scattering layer has a thickness of from 3 to 15 μm.

An electroluminescent device (EL device) generally realizes emission of white light with the luminescent waveform (i.e., luminescent spectrum) shown in FIG. 2, in which the luminescent intensity is concentrated mainly to two wavelength regions, due to restrictions in luminescent materials.

In the EL device of the invention having two luminescent local maxima, as described above, a first luminescent local maximum (hereinafter, sometimes referred to as a short-wavelength maximum) is in a range of from 450 to 530 nm, and a second luminescent local maximum (hereinafter, sometimes referred to as a long-wavelength maximum) is in a range of 605 nm or more, so as to realize visually white light emission excellent in color rendition.

It is considered that the conventional EL element does not ensure equability in light intensities of wavelengths that are visually sensed as red (R), green (G) and blue (B) although white light is emitted, and as a result, the color rendition thereof is inferior. In the EL device of the invention, on the other hand, it is considered that the two luminescent local maxima are in ranges in the vicinities of the wavelengths that are visually sensed as R, G and B colors by humans (for example, characteristic red color), whereby light emission excellent in color rendition can be obtained. The wavelengths that are visually sensed as R, G and B colors by humans are 610 nm for R color, 530 nm for G color and 450 nm for B color. In the invention, the first luminescent local maximum (short-wavelength maximum) is in a range of from 450 to 530 nm to ensure the intensities of G and B colors, and the second luminescent local maximum (long-wavelength maximum) is in a range of 605 nm or more to ensure the intensity of R color, whereby good color rendition is obtained.

It is preferred in the EL device of the invention that the long-wavelength maximum is in a range of from 605 to 615 nm. In the case where the long-wavelength maximum is in the range, better color rendition can be obtained.

It is preferred that the short-wavelength maximum is in a range of from 477 to 498 nm, and more preferably from 483 to 493 nm. In the case where the short-wavelength maximum is in a range of from 477 to 498 nm (more preferably from 483 to 493 nm), which is in the vicinity of 487 nm as the equilibrium point of G and B colors, the equability of the intensities of G and B colors can be further ensured to provide better color rendition. The equilibrium point of G and B colors (487 nm) herein is a point at which two colors of G and B are visually balanced upon considering G and B colors, and humans strongly sense green color on the long-wavelength side of the point and strongly sense blue color on the short-wavelength side of the point.

It is preferred that the EL device of the invention has a luminescent local minimum in a range of from 565 to 583 nm, and more preferably from 571 to 583 nm. In the case where the luminescent local minimum is in a range of from 565 to 583 nm (more preferably from 571 to 583 nm), which is in the vicinity of 578 nm as the equilibrium point of R and G colors, the R color (the waveform of the long-wavelength maximum) and the G and B colors (the waveform of the short-wavelength maximum) are separated from each other to provide better color rendition. The equilibrium point of R and G colors (578 nm) herein is a point at which two colors of R and G are visually balanced upon considering R and G colors, and humans strongly sense red color on the long-wavelength side of the point and strongly sense green color on the short-wavelength side of the point.

The concepts of the wavelengths at which R, G and B colors are most strongly sensed, and the equilibrium points of colors are based on the opponent color theory (proposed by Judd and Wyszecki on 1975) stating that R color and G color are not simultaneously sensed and B color and Y (yellow) color are not simultaneously sensed. The specific wavelengths therefor can be found, for example, in the opponent color response curved is closed in M, Ikeda, *Shikisai Kogaku no Kiso* (Fundamentals for Color Engineering), p. 237, published by Asakura Shoten.

According to the invention, such an electroluminescent device can be provided that emits white light and is excellent in color rendition.

BRIEF DESCRIPTION OF THE DRAWINGS

In FIG. 2, symbol a represents a luminescent waveform of an inorganic EL device (luminescent local maximum wavelength: 485 nm, 585 nm), symbol b represents a luminescent waveform of an inorganic EL device (luminescent local maximum wavelength: 475 nm, 590 nm), and symbol c represents a luminescent waveform of an inorganic EL device (luminescent local maximum wavelength: 490 nm, 600 nm).

DETAILED DESCRIPTION OF THE INVENTION

Figure 1:
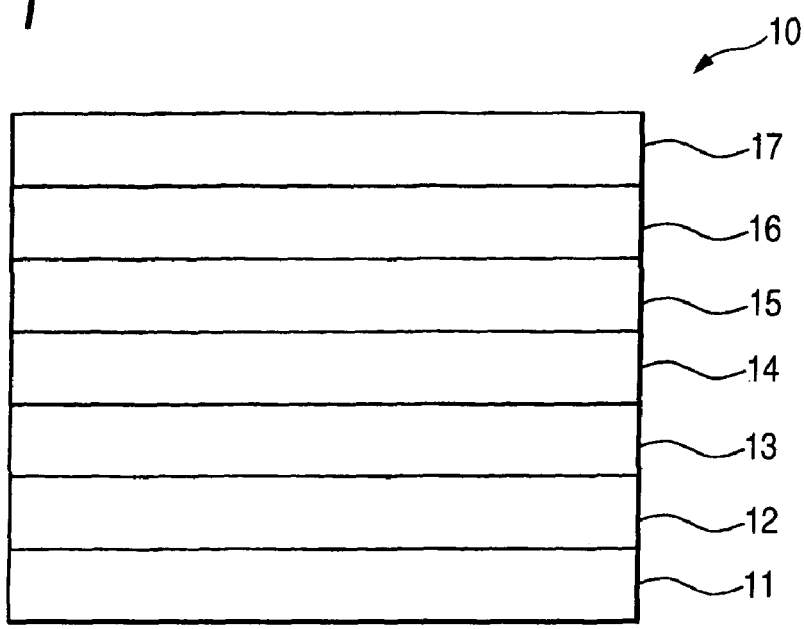
FIG. 1 is a cross sectional view showing an EL device produced in an example of the invention.

The electroluminescent device (EL device) of the invention will be described below.

The EL device of the invention has at least two luminescent local maxima in a visible range. That is, the EL device of the invention emits light having a luminescent spectrum that has at least two luminescent local maximum values in a wavelength range of visible light. The at least two luminescent local maxima includes a first luminescent local maximum and a second luminescent local maximum, the first and second luminescent local maxima having the two largest local maximum values of the at least two luminescent local maxima. That is, the first and second luminescent local maxima each has a larger luminescent intensity than other luminescent local maxima in the visible range. In the invention, the first luminescent local maximum (short-wavelength maximum) in a wavelength range of from 450 to 530 nm (preferably from 477 to 498 nm, and more preferably from 483 to 493 nm) is a blue green luminescence (B+G luminescence), and the second luminescent local maximum (long-wavelength maximum) in a wavelength range of 605 nm or more (preferably from 605 to 615 nm) is a red luminescence (R luminescence).

The B+G luminescence and the R luminescence can be realized by using luminescent materials having luminescent local maxima in the aforementioned wavelength ranges. It is also possible that a color conversion material or the like is used in combination with a luminescent material having a luminescent local maximum on the short-wavelength side of the target wavelength range to shift the luminescent local maximum wavelength to the long-wavelength side, whereby the luminescent local maximum is in the target wavelength range. It is further possible that light of a specific wavelength is cut with a filter, such as a band reflection filter, to adjust the luminescent local maximum wavelength to the target wavelength range.

The luminescent local minimum formed by the aforementioned two luminescence (i.e., the B+G luminescence and the R luminescence) is preferably in a wavelength range of from 565 to 583 nm, and more preferably from 571 to 583 nm.

The luminescent local minimum can be adjusted by the positions of luminescent local maxima and the luminescent intensity ratio of the luminescent materials used for the B+G luminescence and the R luminescence. It is also possible that the target luminescent local minimum is obtained by cutting light of a specific wavelength by using a light absorbing material, such as a dye and a filter.

The EL device preferably has a color temperature of luminescence in a range of from 5,000 to 10,000 K, and more preferably from 6,000 to 10,000 K. Therefore, the range of the short-wavelength maximum value and the long-wavelength maximum value is preferably in a range of from 2/8 to 8/2, and more preferably from 35/65 to 75/25. In this case, the half value width on the long-wavelength side is preferably 80 nm or less.

The EL device of the invention may be constituted by one luminescent unit (EL element) or by plural EL elements.

The EL device of the invention may be an inorganic EL device using fluorescent particles as a luminescent material or may be an organic EL device using a fluorescent or phosphorescent organic compound as a luminescent material. The EL device of the invention means an EL device in the broad sense, and can be applied not only to the so-called thin film EL device, such as an inorganic EL device and an organic EL device, but also to an injection EL device, such as a light emitting diode (LED). In the case of an LED, white luminescence excellent in color rendition can be obtained by providing luminescent local maxima in the aforementioned two specific wavelength ranges.

A dispersion EL device (inorganic EL device) having fluorescent particles dispersed in a binder having a high dielectric constant will be described below as an embodiment of the EL device of the invention.

An EL device of the embodiment contains a light emitting layer including a luminescent layer, a light scattering layer and a pigment layer accumulated in this order, and the light emitting layer are held between a pair of electrodes facing each other, at least one of which is transparent. It is preferred that a dielectric layer inserted between the luminescent layer and the electrode for preventing the EL device from suffering dielectric breakdown and for concentrating a stable electric field to the luminescent layer.

The luminescent layer preferably contains fluorescent particles dispersed in a binder. Examples of the binder include a polymer having a relatively high dielectric constant, such as a cyanoethyl cellulose resin, and resins, such as polyethylene, polypropylene, a polystyrene resin, a silicone resin, an epoxy resin and polyvinylidene fluoride. Fine particles having a high dielectric constant, such as $BaTiO_3$ and $SrTiO_3$, may be mixed with these resins in an appropriate amount to adjust the dielectric constant.

Examples of the mother material of the fluorescent particles that are preferably used in the luminescent layer include fine particles of a semiconductor constituted by one or plural elements selected from the group consisting of the Group II elements and the Group VI elements and one or plural elements selected from the Group III elements and the Group V elements, which may be arbitrarily selected depending on the necessary luminescent wavelength range.

Specific examples thereof include CdS, CdSe, CdTe, ZnS, ZnSe, ZnTe, CaS, MgS, SrS, GaP, GaAs, mixed crystals thereof, $CaGa_2S_4$, $SrGa_2S_4$, and $BaAl_2S_4$, and ZnS, CaS, SrS and the like are preferably used.

As an activating agent, a metallic ion, such as Mn and Cu, and a rare earth element can be preferably used. As a co-activating agent that may be added depending on necessity, a halogen, such as Cl, Br and I, as well as Al and the like may be preferably used.

The fluorescent particles preferably contain a luminescent material of blue green (B+G) color.

As the blue green color luminescent material, a material having a luminescent local maximum in a wavelength range of from 420 to 570 nm is preferred, a material having a luminescent local maximum in a wavelength range of from 450 to 530 nm is more preferred, and a material having a luminescent local maximum in a wavelength range of from 483 to 493 nm is most preferred. A sole luminescent material may be used to obtain blue green light having a luminescent local maximum in a wavelength range of from 450 to 530 nm, or in alternative, plural luminescent materials having different luminescent local maxima may be used to obtain blue green light having a luminescent local maximum in the wavelength range of from 450 to 530 nm as a result of accumulation of luminescence from the respective luminescent materials. In the EL device of the invention, a red luminescent material is used in combination with the blue green luminescent material. The red luminescent material absorbs blue green light and emits red light, and thus the luminescent local maximum observed in the blue green luminescence region is determined by the accumulation of the luminescence of the blue green luminescent material and the absorption of the red luminescent material. Accordingly, a luminescent material having a luminescent local maximum at a wavelength outside the aforementioned wavelength range may also be preferably used in the case where a luminescent local maximum within the aforementioned range can be obtained as a result of accumulation with the absorption of the red luminescent material.

Preferred examples of the fluorescent particles emitting blue green light include zinc sulfide activated with copper and chlorine ((ZnS:Cu,Cl) fluorescent particles) and strontium sulfide particles activated with cerium and copper ((SrS:Ce, Cu) fluorescent particles), and (ZnS:Cu,Cl) fluorescent particles are preferably used. In the (ZnS:Cu,Cl) fluorescent particles, the addition amount of Cu and Cl is preferably in a range of from $1 \times 10^{-4}$ to $1 \times 10^{-2}$ mole, and particularly preferably from $5 \times 10^{-4}$ to $5 \times 10^{-3}$ mole, per 1 mole of ZnS. According to the configuration, two luminescent peaks around 460 nm and 500 nm are overlapped with each other to obtain EL light of blue green color.

It is also preferred for adjustment of the luminescent color of the EL device that an EL fluorescent material emitting blue light, such as (ZnS:Cu,Br) and (ZnS:Cu,I) and an EL fluorescent material emitting green light, such as (ZnS:Cu,Al) are mixed with the EL fluorescent material emitting blue green light, and an EL fluorescent material emitting blue light and an EL fluorescent material emitting green light are mixed with each other.

In the case where the blue green luminescent local maximum is at a wavelength of 498 nm or more, it is preferred that a red luminescent material absorbing light around a wavelength of from 500 to 530 nm in a larger amount is used to make the luminescent local maximum of the blue green luminescent region observed in the EL spectrum at 498 nm or less, and more preferably 493 nm or less.

The fluorescent particles that can be used in the luminescent layer are preferably produced by the baking method (solid phase method), in which a mixture of a fluorescent mother material and a fusing agent is baked. In addition thereto, it is preferred that monodisperse fluorescent particles can be obtained by the hydrothermal synthesizing method, in which the fluorescent particles are synthesized in a solvent heated and pressurized, the urea fusing method, in which fused urea is used as a reaction solvent, and the spray-pyrolysis method, in which minute droplets of a fluorescent material precursor solution are thermally decomposed.

Upon producing the fluorescent particles, it is preferred that a step of applying a physical impact is provided in the production process for improving the brightness of the EL device.

The fluorescent particles preferably have a sphere equivalent average particle diameter of from 0.1 to 15 μm suitable for thinning the luminescent layer. The fluorescent particles preferably have, on the surface thereof, a non-fluorescent shell layer of an oxide or a nitride having a thickness of from 0.01 to 1.0 μm for preventing the particles from being deteriorated with moisture.

The thickness of the luminescent layer of the invention (thickness after drying the layer) is preferably from 0.5 to 30 μm, and the total thickness of the luminescent layer and the dielectric layer (i.e., the thickness of the light emitting layer) held with the electrode pair is preferably from 1 to 50 μm, for increasing the electric field intensity applied to the EL device to obtain high brightness.

The content of the fluorescent material in the luminescent layer is preferably from 40 to 95% by weight for increasing the particle density to obtain high brightness.

In the light scattering layer, dielectric material particles having a high visible light reflectivity are preferably used. The dielectric material particles having a high visible light reflectivity are preferably selected from oxides and nitrides of metals, and examples thereof include $TiO_2$, $BaTiO_3$, $SrTiO_3$, $PbTiO_3$, $KNbO_3$, $PbNbO_3$, $Ta_2O_3$, $BaTa_2O_6$, $LiTaO_3$, $Y_2O_3$, $Al_2O_3$, $ZrO_3$, AlON and ZnS. The dielectric material particles are preferably dispersed in a binder. As the binder, a polymer having a relatively high dielectric constant, such as a cyanoethyl cellulose resin, and resins, such as polyethylene, polypropylene, a polystyrene resin, a silicone resin, an epoxy resin and polyvinylidene fluoride are preferably used.

The light scattering layer preferably has a thickness of from 3 to 15 μm.

The pigment layer preferably contains a fluorescent pigment that emits light through absorption of a part of the blue green light emitted from the aforementioned blue green luminescent EL fluorescent material (i.e., the fluorescent pigment is the red luminescent material). The pigment layer may further contain a fluorescent dye in addition to the fluorescent pigment. Preferred examples of a compound constituting the luminescent center of the fluorescent pigment or the fluorescent dye include compounds having rhodamine, lactone, xanthene, quinoline, benzothiazole, triethylindoline, perylene, triphenylene or dicyanomethylene as a skeleton, and also include a cyanine dye, an azo dye, a polyphenylenevinylene polymer, a disilane-oligothienylene polymer, a ruthenium complex, an europium complex and an erbium complex.

Among these compounds, a compound having a luminescent local maximum of the luminescent spectrum in a range of from 550 to 650 nm is preferred, a compound having a luminescent local maximum in a range of from 590 to 630 nm is more preferred, a compound having a luminescent local maximum in a range of from 605 to 615 nm is further preferred, and a compound having a luminescent local maximum at 610 nm is most preferred. The compound may be used solely, and plural kinds thereof may be used in combination. Specific examples of the fluorescent pigment having a luminescent local maximum in the aforementioned range include FA-007, produced by Shinloihi Co., Ltd.

Even in the case where a luminescent local maximum cannot be obtained in a range of from 550 to 650 nm with the fluorescent pigment or the fluorescent dye, the luminescent local maximum wavelength can be adjusted within the range by using a filter, such as band reflection filter.

As the binder for the pigment layer, those exemplified for the light scattering layer can be preferably used. The concentration of the fluorescent pigment in the pigment layer is preferably as high as possible. The pigment layer may contain the material used in the light scattering layer dispersed as fine particles.

The thickness of the pigment layer is preferably from 3 to 20 μm, and more preferably from 3 to 15 μm.

In the dielectric layer, an arbitrary material may be used as far as it is a material having a high dielectric constant and a high insulating property and having a high dielectric breakdown voltage. Specifically, the materials exemplified for the light scattering layer (such as oxides and nitrides of metals) may be preferably used. As the binder used in the dielectric layer, those exemplified for the light scattering layer may be used.

While particles may be added to the dielectric layer, the layer is preferably provided as a uniform film or provided as a film having a particle structure, and the combination thereof may be used. The state where the film is uniform means that the dielectric layer itself is an amorphous layer or a layer having a crystalline structure, and examples of the uniform film include a thin crystal layer. In the case where the dielectric layer is a uniform film, the thickness of the film is preferably in a range of from 0.1 to 10 μm.

The content of the dielectric material particles in the dielectric layer is preferably from 40 to 95% by weight for increasing the dielectric constant of the dielectric layer to concentrate the electric field to the luminescent layer.

In the EL device of the embodiment, the wavelengths of the luminescent local maxima and the luminescent local minimum can be adjusted in the following manner.

In the embodiment, the fluorescent pigment that can be used in the pigment layer has an overlap on wavelength of the luminescent band and the absorption band of the pigment, and the shape of the luminescent band on the short-wavelength side is changed by absorbing light that has been emitted by the pigment itself. Accordingly, the apparent position of the luminescent local maximum can be changed by changing the manner of applying light to the fluorescent pigment in the pigment layer or changing the extent of light absorption of the pigment, whereby the luminescent local maximum wavelength of the fluorescent pigment in the EL device can be adjusted to the target wavelength. In the embodiment, the pigment layer is held between the light scattering layer and the dielectric layer, whereby the light incident from the luminescent layer suffers multiple reflection and multiple scattering, so as to control the state of light scattering around the pigment layer. The state of light scattering around the pigment layer is thus controlled, whereby the self-absorption of the fluorescent pigment is changed to obtain the target luminescent local maximum wavelength.

The luminescent layer, the light scattering layer, the pigment layer and the dielectric layer are preferably formed by such a coating method as the spin coating method, the dip coating method, the bar coating method and the spray coating method. A method capable of attaining continuous coating, such as the slide coating method and the extrusion coating method, is particularly preferably used.

As the electrode, a metallic electrode, such as aluminum and silver, may be used. The transparent electrode preferably has a surface resistance of from 0.01 to 30Ω per square for improving the brightness and suppressing luminescent unevenness. Specific examples thereof include indium tin oxide (ITO) and indium zinc oxide (IZO).

The EL device of the invention is preferably sealed in vacuum or in a dry atmosphere controlled in dew point by using a damp proof film having a water vapor permeability of 0.05 $g/m^2$/day at 40° C. 90% RH for preventing the EL device being deteriorated with moisture.

In order to cancel or absorb vibrations and noises caused by driving the EL device, it is preferred that a compensation electrode is provided through an insulating layer, to which a voltage having an opposite phase to the voltage applied to the luminescent layer is applied, and a buffering material layer is provided in the EL device.

EXAMPLE

The invention will be described in detail with reference to the examples below, but the invention is not construed as being limited thereto.

Example 1

Production Example 1 of EL Device of the Invention

Zinc sulfide particles activated with copper and chlorine having a luminescent local maximum at 498 nm and an average particle diameter of 15 μm were mixed with and dispersed in a 30% by weight cyanoethyl cellulose solution (CR-S, produced by Shin-Etsu Chemical Co., Ltd., hereinafter the same) to a weight ratio of 1.2/1, so as to prepare a coating composition for a luminescent layer. Separately, ITO was uniformly attached by sputtering to a thickness of 40 nm on a polyethylene terephthalate (PET) film having a thickness of 100 μm to form an ITO layer. The coating composition for a luminescent layer was coated on the ITO layer and dried by using an air dryer at 110° C. for 5 hours to form a luminescent layer having a thickness of 50 μm.

$BaTiO_2$ fine particles having an average particle diameter of 0.2 μm (BT-8, produced by Cabot Speciality Chemicals Co., Ltd., hereinafter the same) were dispersed in a 30% by weight cyanoethyl cellulose solution to prepare a coating composition for a light scattering layer. The coating composition for a light scattering layer was coated on the aforementioned luminescent layer and dried at 110° C. for 5 hours to form a light scattering layer. The thickness of the light scattering layer was changed from 3 to 15 μweighthown in Table 1 shown later.

30% of red pigment (Shinloihi FA-007, produced by Shinloihi Co., Ltd., hereinafter the same) was dispersed in cyclohexanol to prepare a coating composition for a pigment layer. The coating composition for a pigment layer was coated on the aforementioned light scattering layer and dried at 110° C. for 2 hours to form a pigment layer. The coated amount of the red pigment was adjusted to provide both the x and y values of the coordinate of the EL device on the chromaticity diagram within a range of from 0.32 to 0.34.

$BaTiO_2$ fine particles having an average particle diameter of 0.2 μm were dispersed in a 30% by weight cyanoethyl cellulose solution to prepare a coating composition for a dielectric layer. The coating composition for a dielectric layer was coated on an aluminum sheet having a thickness of 75 μm to form a dielectric layer. The dielectric layer formed on the aluminum sheet and the pigment layer were adhered by pressing under heat. The thickness of the dielectric layer was determined to make a total thickness with the light scattering layer of 25 μm. Conductive chips were attached to the sheet thus obtained, and the sheet was sealed with a damp proof film to fabricate EL devices (1) to (5).

Figure 2:
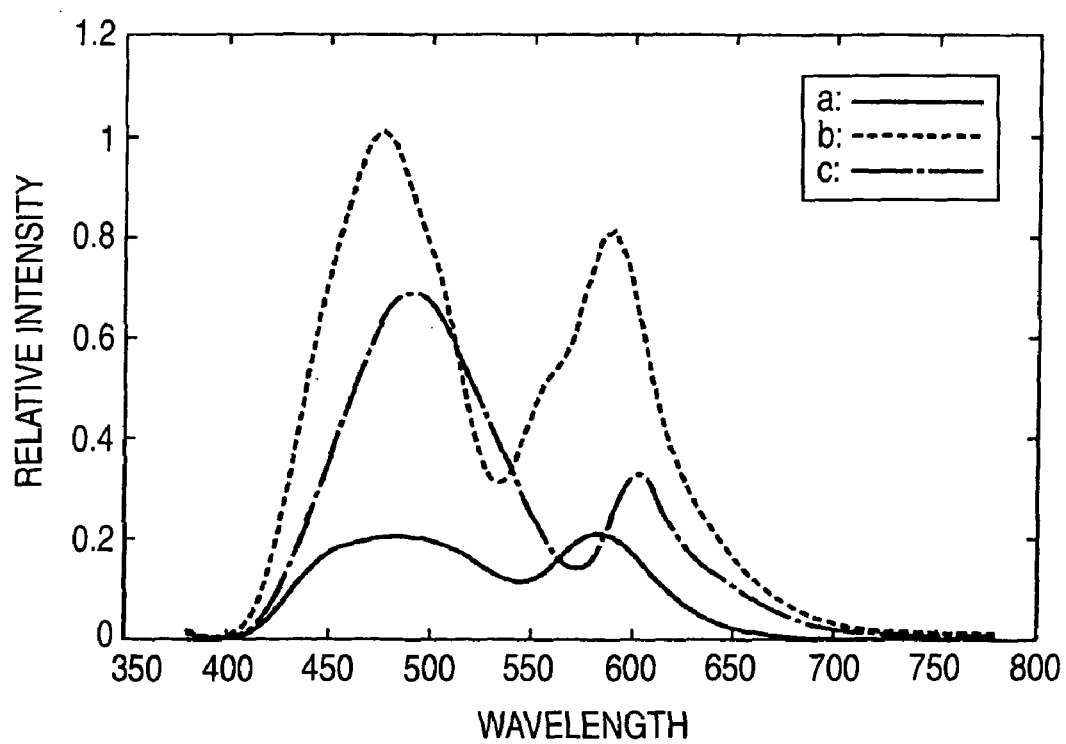
FIG. 2 is a graph showing luminescent waveforms of representative dispersion EL elements emitting white light.

FIG. 1 is a cross sectional view showing the EL device produced in Example 1. The EL device 10 shown in FIG. 2 has the PET film 11 having formed thereon the ITO layer 12 as a transparent electrode, the luminescent layer 13, the light scattering layer 14, the pigment layer 15, the dielectric layer 16 and the aluminum sheet 17 as a metallic electrode, accumulated in this order. The conductive chips and the damp proof film are not shown in FIG. 2.

Example 2

Production Example 2 of EL Device of the Invention

EL devices (6) to (11) were produced in the same manner as in Production Example 1 except that the zinc sulfide particles in the luminescent layer were changed to 40% by weight of particles having a luminescent local maximum at 450 nm and the balance (60% by weight) of particles having a luminescent local maximum at 498 nm, and the addition amount of the red pigment in the pigment layer was changed to 10% by weight.

Comparative Example 1

Zinc sulfide particles activated with copper and chlorine having a luminescent local maximum at 498 nm and an average particle diameter of 15 μm were mixed with and dispersed in a 30% by weight cyanoethyl cellulose solution to a weight ratio of 1.2/1, to which a red pigment, produced by Shinloihi Co., Ltd., was added in an amount 3% by weight based on the zinc sulfide particles, so as to prepare a coating composition for a luminescent layer. Separately, ITO was uniformly attached by sputtering to a thickness of 40 nm on a PET film having a thickness of 100 μm to form an ITO layer. The coating composition for a luminescent layer was coated on the ITO layer and dried by using an air dryer at 110° C. for 5 hours to form a luminescent layer having a thickness of 50 μm.

$BaTiO_2$ fine particles having an average particle diameter of 0.2 μm were dispersed in a 30% by weight cyanoethyl cellulose solution to prepare a coating composition for a dielectric layer. The coating composition for a dielectric layer was coated on an aluminum sheet having a thickness of 75 μm and dried at 110° C. for 5 hours to form a dielectric layer having a thickness of 25 μm. The dielectric layer formed on the aluminum sheet and the pigment layer were adhered by pressing under heat. Conductive chips were attached to the sheet thus obtained, and the sheet was sealed with a damp proof film to fabricate an EL device of Comparative Example 1.

Comparative Example 2

Zinc sulfide particles activated with copper and chlorine having a luminescent local maximum at 498 nm and an average particle diameter of 15 μm were mixed with and dispersed in a 30% by weight cyanoethyl cellulose solution to a weight ratio of 1.2/1, so as to prepare a coating composition for a luminescent layer. Separately, ITO was uniformly attached by sputtering to a thickness of 40 nm on a PET film having a thickness of 100 μm to form an ITO layer. The coating composition for a luminescent layer was coated on the ITO layer and dried by using an air dryer at 110° C. for 5 hours to form a luminescent layer having a thickness of 50 μm.

$BaTiO_2$ fine particles having an average particle diameter of 0.2 μm were dispersed in a 30% by weight cyanoethyl cellulose solution, to which a red pigment, produced by Shinloihi Co., Ltd., was added and dispersed in the same amount as $BaTiO_2$. The resulting dispersion liquid was coated on the aforementioned luminescent layer to a finish thickness of 8 μm and again dried at 110° C. for 5 hours to form a pigment layer.

$BaTiO_2$ fine particles having an average particle diameter of 0.2 μm were dispersed in a 30% by weight cyanoethyl cellulose solution, and the resulting dispersion liquid was coated on an aluminum sheet having a thickness of 75 μm and dried to form a dielectric layer having a thickness of 17 μm. The dielectric layer and the aforementioned pigment layer were adhered by pressing under heat. Conductive chips were attached to the sheet thus obtained, and the sheet was sealed with a damp proof film to fabricate an EL device of Comparative Example 2.

The EL devices thus produced were driven, and white luminescence was obtained with two luminescent local maxima in the visible region in each case. The wavelengths of the luminescent local maxima and the luminescence minimum of the EL devices are shown in Table 1 below.

TABLE 1

| Sample | Thickness of light scattering layer (μm) | Luminescent local maximum on short-wavelength side (nm) | Luminescent local minimum (nm) | Luminescent local maximum on long-wavelength side (nm) |
|---|---|---|---|---|
| Comparative Example 1 | — | 478 | 531 | 585 |
| Comparative Example 2 | — | 479 | 535 | 590 |
| EL device (1) | 5 | 498 | 565 | 605 |
| EL device (2) | 7 | 498 | 571 | 612 |
| EL device (3) | 10 | 499 | 568 | 610 |
| EL device (4) | 12 | 500 | 566 | 608 |
| EL device (5) | 15 | 500 | 565 | 608 |
| EL device (6) | 3 | 496 | 565 | 605 |
| EL device (7) | 5 | 498 | 568 | 608 |
| EL device (8) | 7 | 497 | 572 | 612 |
| EL device (9) | 10 | 499 | 575 | 616 |
| EL device (10) | 12 | 499 | 571 | 610 |
| EL device (11) | 15 | 500 | 572 | 610 |

(Brightness upon driving EL device at 100 V and 1 kHz)

A transparent medium having an image formed thereon was placed on the EL device, and the image was observed. The EL devices of the invention could vibrantly express red color in comparison to the EL device of the comparative examples since the luminescent local maximum wavelength of red color luminescence was shifted to the long-wavelength side, and thus the EL devices of the invention could provide luminescence excellent in color rendition.

It will be apparent to those skilled in the art that various modifications and variations can be made to the described preferred embodiments of the invention without departing from the spirit or scope of the invention. Thus, it is intended that the invention cover all modifications and variations of this invention consistent with the scope of the appended claims and their equivalents.

The present application claims foreign priority based on Japanese Patent Application Nos. JP2004-79640 and JP2004-354950, filed Mar. 19 of 2004 and Dec. 8 of 2004, respectively, the contents of which is incorporated herein by reference.

What is claimed is:

1. An electroluminescent device which comprises:
a pair of electrodes, at least one of the pair of the electrodes being a transparent electrode; and
a light emitting layer between the pair of the electrodes, wherein the light emitting layer comprises: a luminescent layer; a light scattering layer; and a pigment layer in this order, starting from said transparent electrode;
and wherein the electroluminescent device has at least two luminescent local maxima in a visible range, wherein the electroluminescent device has a first luminescent local maximum in a range of from 477 to 498 nm, and the electroluminescent device has a second luminescent local maximum in a range of 605 nm or more, and wherein the first and second luminescent local maxima are the two largest of all other luminescent local maxima.

2. The electroluminescent device as claimed in claim 1, which has the second luminescent local maximum in a range of from 605 to 615 nm.

3. The electroluminescent device as claimed in claim 1, which has the first luminescent local maximum in a range of from 483 to 493 nm.

4. The electroluminescent device as claimed in claim 3, wherein the local maxima are the equilibrium points of two colors.

5. The electroluminescent device as claimed in claim 4, wherein the two colors are green and blue.

6. The electroluminescent device as claimed in claim 1, which has a luminescent local minimum in a range of from 565 to 583 nm.

7. The electroluminescent device as claimed in claim 1, which device has a luminescent local minimum in a range of from 571 to 583 nm.

8. The electroluminescent device as claimed in claim 6 or 7, wherein the local minima are the equilibrium points of two colors.

9. The electroluminescent device as claimed in claim 8, wherein the two colors are green and red.

10. The electroluminescent device as claimed in claim 1, which has a ratio of a value of the relative intensity at the first luminescent local maximum to a value of the relative intensity at the second luminescent local maximum of from 2/8 to 8/2.

11. The electroluminescent device as claimed in claim 1, wherein the light emitting layer includes a dielectric layer.

12. The electroluminescent device as claimed in claim 1, wherein the light scattering layer has a thickness of from 3 to 15 μm.

13. The electroluminescent device as claimed in claim 1, wherein the luminescent device has a color temperature of luminescence in a range of 5,000 to 10,000 K.

14. The electroluminescent device as claimed in claim 13, wherein the luminescent device has a color temperature of luminescence in a range of 6,000 to 10,000 K.

15. The electroluminescent device as claimed in claim 1, wherein the electroluminescent device is an inorganic electroluminescent device, and wherein the inorganic electroluminescent device comprises a fluorescent particle as a luminescent material.

16. The electroluminescent device as claimed in claim 15, wherein the fluorescent particle is activated zinc sulfide or activated strontium sulfide.

* * * * *